United States Patent
Ren et al.

(10) Patent No.: US 10,777,413 B2
(45) Date of Patent: Sep. 15, 2020

(54) INTERCONNECTS WITH NON-MANDREL CUTS FORMED BY EARLY BLOCK PATTERNING

(71) Applicant: GLOBALFOUNDRIES Inc., Grand Cayman (KY)

(72) Inventors: Yuping Ren, Clifton Park, NY (US); Guoxiang Ning, Clifton Park, NY (US); Haigou Huang, Rexford, NY (US); Sunil K. Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/033,714

(22) Filed: Jul. 12, 2018

(65) Prior Publication Data

US 2020/0020531 A1 Jan. 16, 2020

(51) Int. Cl.
| | |
|---|---|
| *H01L 21/033* | (2006.01) |
| *H01L 21/02* | (2006.01) |
| *H01L 21/311* | (2006.01) |
| *H01L 21/768* | (2006.01) |

(52) U.S. Cl.
CPC .... *H01L 21/0337* (2013.01); *H01L 21/02164* (2013.01); *H01L 21/02186* (2013.01); *H01L 21/02271* (2013.01); *H01L 21/0332* (2013.01); *H01L 21/0338* (2013.01); *H01L 21/31144* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 8,298,954 B1* | 10/2012 | Arnold | H01L 21/0337 |
| | | | 257/E21.235 |
| 8,850,369 B2 | 9/2014 | Lung et al. | |
| 9,177,797 B2 | 11/2015 | Chang et al. | |
| 9,240,346 B2* | 1/2016 | Lee | H01L 21/76816 |
| 9,478,462 B1* | 10/2016 | Wang | H01L 21/76898 |
| 9,551,923 B2 | 1/2017 | Wang et al. | |
| 9,711,372 B2* | 7/2017 | Lee | H01L 21/76816 |
| 9,741,613 B1* | 8/2017 | Zhang | H01L 21/76897 |
| 9,953,834 B1* | 4/2018 | Sun | H01L 21/76816 |
| 10,032,632 B2* | 7/2018 | Arnold | H01L 21/0337 |
| 10,192,780 B1* | 1/2019 | Wang | H01L 21/76816 |
| 10,249,496 B2* | 4/2019 | Shu | H01L 21/0337 |
| 10,319,626 B1* | 6/2019 | Tang | H01L 21/76816 |
| 2004/0185634 A1* | 9/2004 | Lim | H01L 21/3141 |
| | | | 438/396 |

(Continued)

*Primary Examiner* — David E Graybill
(74) *Attorney, Agent, or Firm* — Thompson Hine LLP; Anthony Canale

(57) ABSTRACT

Methods of fabricating an interconnect structure. A hardmask is deposited over a dielectric layer, and a block mask is formed that is arranged over an area on the hardmask. After forming the block mask, a first mandrel and a second mandrel are formed on the hardmask. The first mandrel is laterally spaced from the second mandrel, and the area on the hardmask is arranged between the first mandrel and the second mandrel. The block mask may be used to provide a non-mandrel cut separating the tips of interconnects subsequently formed in the dielectric layer.

19 Claims, 5 Drawing Sheets

(56) References Cited

U.S. PATENT DOCUMENTS

| | | | |
|---|---|---|---|
| 2012/0058640 A1* | 3/2012 | Kim | H01L 21/0337 |
| | | | 438/675 |
| 2012/0282779 A1* | 11/2012 | Arnold | H01L 21/0337 |
| | | | 438/703 |
| 2014/0273433 A1* | 9/2014 | Lee | H01L 21/76816 |
| | | | 438/637 |
| 2015/0147882 A1* | 5/2015 | Yao | H01L 21/76879 |
| | | | 438/675 |
| 2015/0179435 A1* | 6/2015 | Wu | H01L 21/308 |
| | | | 438/702 |
| 2016/0064248 A1* | 3/2016 | Lee | H01L 21/76816 |
| | | | 438/637 |
| 2016/0329435 A1* | 11/2016 | Fanelli | H01L 29/78696 |
| 2018/0096846 A1* | 4/2018 | Arnold | H01L 21/0337 |
| 2018/0144979 A1* | 5/2018 | Law | H01L 21/0337 |
| 2018/0261457 A1* | 9/2018 | Law | H01L 21/0276 |
| 2018/0286682 A1* | 10/2018 | Arnold | H01L 21/0337 |
| 2018/0323067 A1* | 11/2018 | Shu | H01L 21/0337 |
| 2019/0181040 A1* | 6/2019 | Tang | H01L 21/76816 |
| 2019/0355658 A1* | 11/2019 | Srivastava | H01L 21/0332 |

* cited by examiner

INTERCONNECTS WITH NON-MANDREL CUTS FORMED BY EARLY BLOCK PATTERNING

BACKGROUND

The present invention relates to semiconductor device fabrication and integrated circuits and, more specifically, to methods of self-aligned multiple patterning.

Device structures, which have been fabricated on a substrate during front-end-of-line processing, may be connected with each other and with the environment external to the chip by an interconnect structure. Self-aligned patterning processes used to form a back-end-of-line interconnect structure involve the formation of linear mandrels acting as sacrificial features that establish a feature pitch. Sidewall spacers are formed adjacent to the sidewalls of the mandrels and non-mandrel lines are arranged as linear spaces between the sidewall spacers. After pulling the mandrels to define mandrel lines, the sidewall spacers are used as an etch mask to transfer a pattern predicated on the mandrel lines and the non-mandrel lines into an underlying hardmask. The pattern is subsequently transferred to a dielectric layer to define trenches in which the wires of the back-end-of-line interconnect structure are formed.

Mandrel cuts may be formed in the mandrels in order to section the mandrels and define discontinuities between the sections, which are filled by merged portions of the subsequently-formed sidewall spacers. After the mandrel cuts are formed, non-mandrel cuts may also be formed along non-mandrel lines and may include portions of the material used to form the sidewall spacers. The mandrel cuts and non-mandrel cuts are included in the pattern that is transferred to the hardmask and subsequently transferred from the hardmask to form the trenches in the dielectric layer. The mandrel cuts and non-mandrel cuts appear in the interconnect structure as adjacent wires that are spaced apart at their tips with a tip-to-tip spacing related to the dimension of the discontinuity.

The mandrel cuts and the non-mandrel cuts may be sequentially formed by patterning a spin-on hardmask to define respective high-aspect ratio pillars. For each type of cut, the pillars function as etch masks during subsequent etching processes. The organic material of the patterned spin-on hardmask is characterized by a low hardness and weak adhesion, and may exhibit poor macro-loading when performing reactive ion etching. These negative properties of organic materials may lead to pillar flapping or even missing pillars that each are capable of producing systematic defects in the interconnect structure.

Improved methods of self-aligned multiple patterning are needed.

SUMMARY

In an embodiment of the invention, a method includes depositing a hardmask over a dielectric layer, and forming a block mask that is arranged over an area on the hardmask. After forming the block mask, a first mandrel and a second mandrel are formed on the hardmask. The first mandrel is laterally spaced from the second mandrel, and the area on the hardmask is arranged between the first mandrel and the second mandrel. The block mask may be used to provide a non-mandrel cut separating the tips of interconnects subsequently formed in the dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 2A is a top view of the structure at the fabrication stage of FIG. 2 and in which FIG. 2 is taken generally along line 2-2.

FIG. 11A is a top view of the structure at the fabrication stage of FIG. 11 and in which FIG. 11 is taken generally along line 11-11.

DETAILED DESCRIPTION

Figure 1:
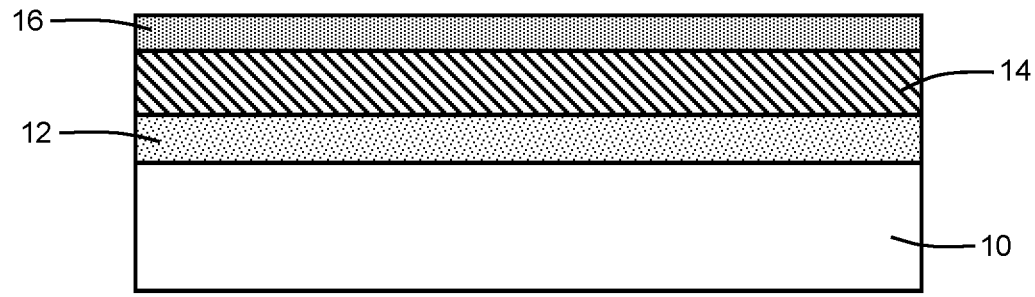
FIGS. 1-11 are cross-sectional views of a structure at successive fabrication stages of a processing method in accordance with embodiments of the invention.

With reference to FIG. 1 and in accordance with embodiments of the invention, a dielectric layer 10 may be composed of an electrically-insulating dielectric material, such as silicon dioxide or a low-k dielectric material like silicon oxynitride (SiON). The dielectric layer 10 may be located on a substrate that includes device structures fabricated by front-end-of-line (FEOL) processing to form an integrated circuit. A layer stack including a hardmask 12 and a hardmask 14 is arranged over the dielectric layer 10 with the hardmask 12 arranged in a vertical direction between the dielectric layer 10 and the hardmask 14.

The hardmasks 12, 14 are used to perform pattern transfer to the dielectric layer 10 during a self-aligned multiple patterning process, such as self-aligned double patterning (SADP). The hardmasks 12, 14 are composed of different materials characterized by dissimilar etch selectivities. The hardmask 12 may be composed of a metal, such as titanium nitride (TiN), deposited by, for example, physical vapor deposition (PVD). The hardmask 14 is removable from the hardmask 12 selective to the material of the hardmask 12, and the hardmask 12 is removable from the dielectric layer 10 selective to the material of the hardmask 10. The hardmask 14 may be composed of a dielectric material, such as silicon nitride ($Si_3N_4$), deposited by, for example, atomic layer deposition (ALD) or chemical vapor deposition (CVD). As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

A material layer 16 is formed on the top surface of the hardmask 14. In an embodiment, the material layer 16 is composed of an inorganic dielectric material, such as titanium dioxide ($TiO_2$) or silicon dioxide ($SiO_2$), deposited by, for example, chemical vapor deposition. In an embodiment, the material layer 16 is composed of an oxide. The inorganic dielectric material constituting the material layer 16 is chosen to be selectively removed relative to the dielectric material of the hardmask 14.

Figure 2:
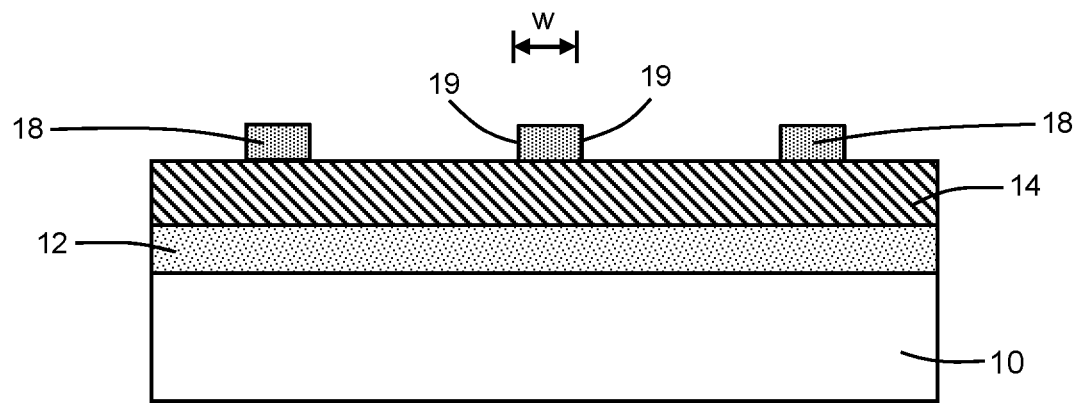
Figure 2A:
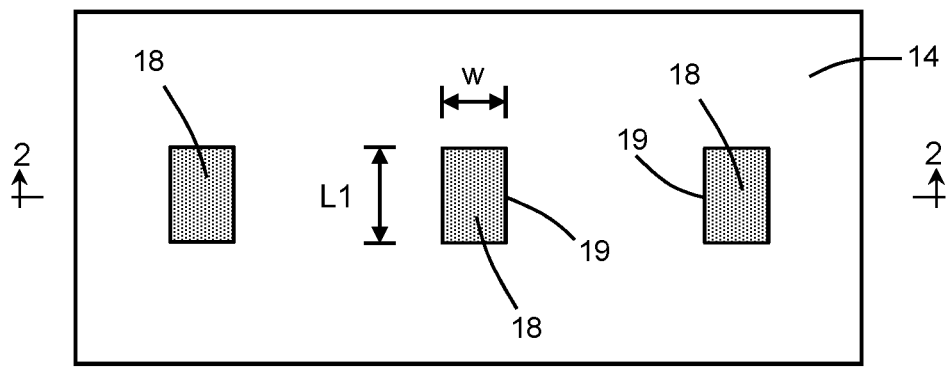

With reference to FIGS. 2, 2A in which like reference numerals refer to like features in FIG. 1 and at a subsequent fabrication stage of the processing method, the material layer 16 is patterned to form block masks 18 that are arranged at designated locations on the top surface of the hardmask 14 and that are subsequently used in the process flow to provide non-mandrel cuts in subsequently-formed interconnects. Each block mask 18 is characterized by lateral dimensions that are established during patterning. In an embodiment, each block mask 18 are rectangular with a length, L1, and a width, W, that are established during patterning. The width, W, may be measured between opposite side edges 19 of each block mask 18.

The block masks 18 may be patterned from the material layer 16 with a lithography and etching process. The hardmask 14 may function as an etch stop for the etching process. In an embodiment, the block masks 18 may be patterned from a strip or bar of the constituent inorganic dielectric material with a lithography and etching process that relies on the same photomask subsequently used for the mandrel etch. The patterning of the block masks 18 before mandrel formation does not impact the subsequent patterning of the mandrels because overlap is absent between these different types of features.

Figure 3:
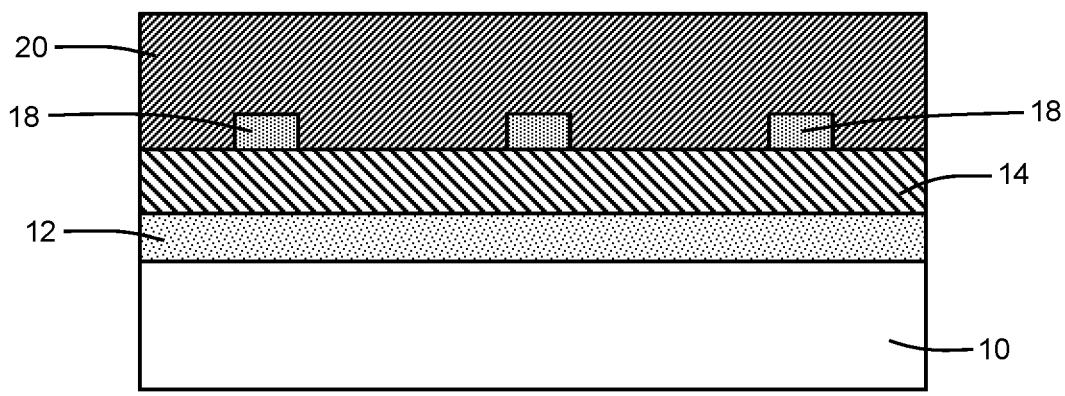

With reference to FIG. 3 in which like reference numerals refer to like features in FIG. 2 and at a subsequent fabrication stage of the processing method, a sacrificial layer 20 is formed over the hardmask 14 and the block masks 18. The sacrificial layer 20 is thicker than the block masks 18 such that the block masks 18 are buried within the sacrificial layer 20. The material constituting the sacrificial layer 20 is chosen such that the sacrificial layer 20 can be selectively removed relative to the dielectric material of the block masks 18. For example, the sacrificial layer 20 may be composed of amorphous silicon (a-Si) deposited by chemical vapor deposition.

Figure 4:
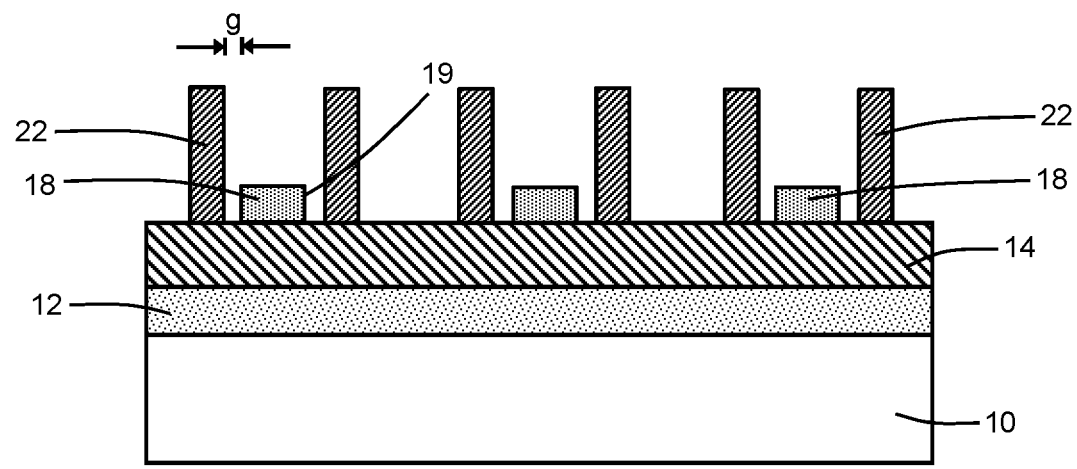

With reference to FIG. 4 in which like reference numerals refer to like features in FIG. 3 and at a subsequent fabrication stage of the processing method, mandrels 22 are formed from the sacrificial layer 20 and are arranged on a top surface of the hardmask 14. For example, a lithography and etching process may be used to pattern the sacrificial layer 20 and form the mandrels 22 as a set of spaced-apart shapes that are aligned parallel or substantially parallel and that are placed with a given layout. As a result of placement of the mandrels 22, the block masks 18 and the mandrels 22 have a non-overlapping arrangement, and each of the block masks 18 is arranged between an adjacent pair of the mandrels 22 with the mandrels 22 spaced from the opposite side edges 19 of the block masks 18 by respective spaces or gaps, g. The block masks 18 are patterned to be narrower in width than the width of the gaps separating adjacent pairs of the mandrels 22 to provide the spacing relating to the mandrels 22, and the block masks 18 are exposed by the patterning of the sacrificial layer 20 to form the mandrels 22. One or more mandrel cuts (not shown) may be formed in the mandrels 22 by lithography and etching that are transferred as discontinuities in interconnects subsequently formed along mandrel lines in the dielectric layer 10.

Figure 5:
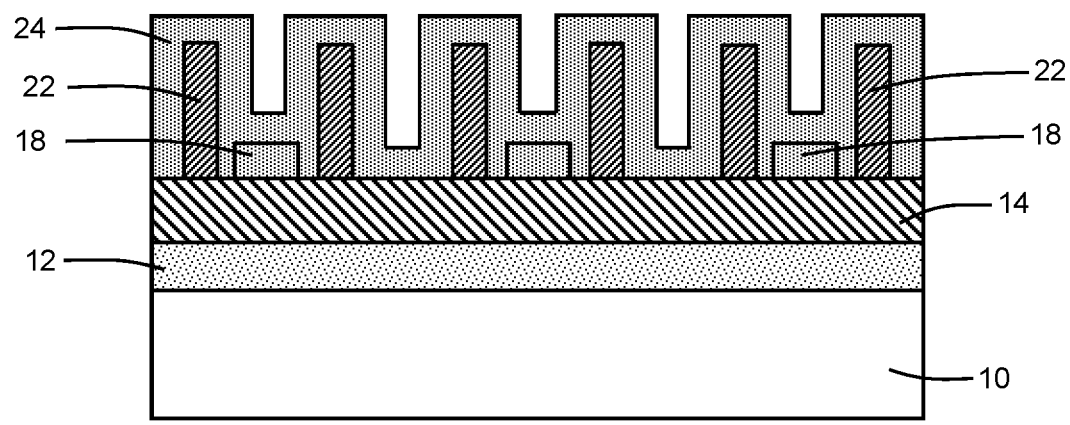

With reference to FIG. 5 in which like reference numerals refer to like features in FIG. 4 and at a subsequent fabrication stage of the processing method, a conformal layer 24 composed of a dielectric material is deposited with a given thickness using, for example, atomic layer deposition. The dielectric material constituting the conformal layer 24 may be chosen such that the mandrels 22 can be removed by a given etch chemistry selective to the dielectric material of the conformal layer 24. For example, if the mandrels 22 are composed of amorphous silicon, the dielectric material constituting the conformal layer 24 may be composed of such as titanium dioxide ($TiO_2$) or silicon dioxide ($SiO_2$).

Because the dielectric material constituting the block masks 18 is also chosen such that the mandrels 22 can be pulled without removing the block masks 18, the dielectric materials constituting the conformal layer 24 and the block masks 18 may be chosen to have the same or similar etch selectivity to the etching process removing the mandrels 22. In an embodiment, the dielectric material constituting the conformal layer 24 may be the same as the dielectric material constituting the block masks 18. For example, if the block masks 18 are composed of titanium dioxide ($TiO_2$), the conformal layer 24 may be composed of titanium dioxide ($TiO_2$). As another example, if the block masks 18 are composed of silicon dioxide ($SiO_2$), the conformal layer 24 may be composed of silicon dioxide ($SiO_2$). As another example, if the block masks 18 are composed of an oxide, the conformal layer 24 may be composed of an oxide.

In conventional process flows, pillars for defining non-mandrel cuts would be formed subsequent to the deposition of the mandrels 22 and conformal layer 24, and would cover respective portions of the dielectric material of the conformal layer 24. The pillars of conventional process flows are patterned from a spin-on hardmask that is composed of an organic material, such as a polymer or an organic planarization material. The inorganic dielectric material chosen for the block masks 18 may overcome the low hardness, weak adhesion, and poor macro-loading under reactive ion etching observed in connection with pillars composed of an organic material, and may reduce or eliminate the occurrence of pillar flapping or missing pillars and the incidence of the related systematic defects in the interconnect structure.

Figure 6:
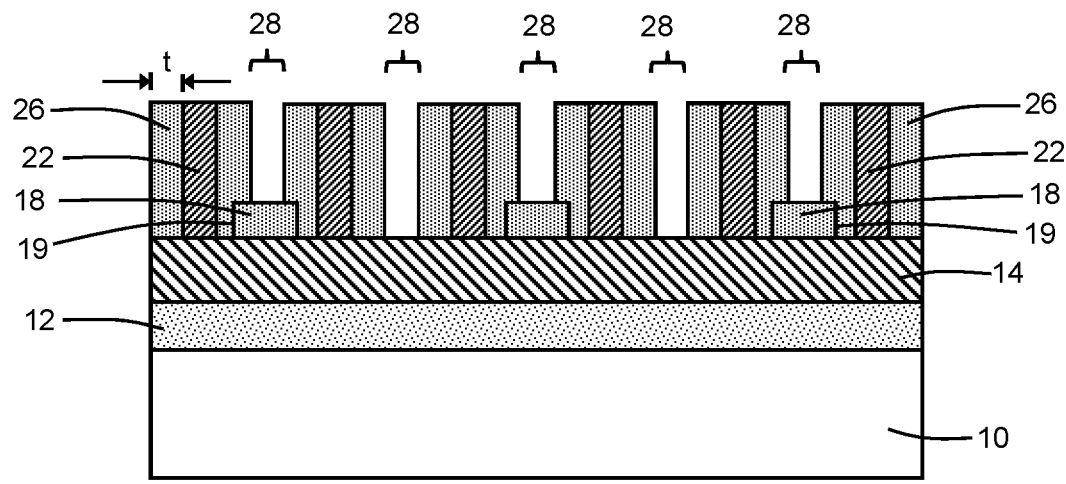

With reference to FIG. 6 in which like reference numerals refer to like features in FIG. 5 and at a subsequent fabrication stage of the processing method, sidewall spacers 26 are shaped from the conformal layer 24 on the hardmask 14 at locations adjacent to the vertical sidewalls of the mandrels 22. The sidewall spacers 26 may be formed by shaping the conformal layer 24 with an anisotropic etching process, such as reactive ion etching (ME), that removes the material of the conformal layer 24 selective to the materials of the hardmask 14 and the mandrels 22. The sidewall spacers 26 have a thickness, t, that may be equal or substantially equal to the thickness of the conformal layer 24. The sidewall spacers 26 overlap with the edges 19 of the block masks 18 such that the gaps between the block masks 18 and mandrels 22 are fully closed. The overlapping relationship may be provided through, among other factors, control over the thickness of the conformal layer 24 and the dimensions of the block masks 18 when patterned to provide the overlapping arrangement.

Non-mandrel lines 28 are defined as linear spaces, which acquire a width related to the thickness of the sidewall spacers 26, that are arranged lengthwise between the sidewall spacers 26 on the mandrels 22 and over which areas of the hardmask 14 are revealed. The block masks 18 may be exposed in part, due to the overlap with their side edges 19, by the etching process forming the sidewall spacers 26. Each of the block masks 18 and, in particular, the portion of each block mask 18 between the side edges 19 not covered by the sidewall spacers 26 interrupts and cuts the continuity of one of the non-mandrel lines 28, and divides the interrupted non-mandrel lines 28 into disjointed and discrete sections. The block masks 18 subsequently define the locations of cuts between pairs of linearly-aligned interconnects subsequently formed in the dielectric layer 10 using the sections of the disjointed non-mandrel lines 28. The length of each block mask 18 in a direction parallel to the length of the sections of the disjointed non-mandrel lines 28 determines a tip-to-tip space or distance between these sections, and subsequently determines an identical or substantially identical tip-to-tip space or distance between the tips or ends of the associated interconnects.

Figure 7:
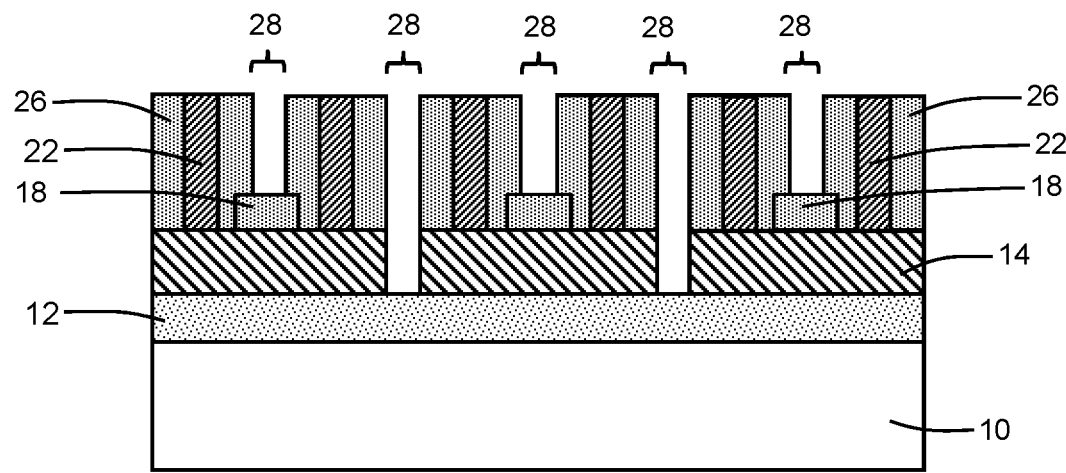

With reference to FIG. 7 in which like reference numerals refer to like features in FIG. 6 and at a subsequent fabrication stage of the processing method, the pattern of block masks 18 and non-mandrel lines 28 is transferred to the hardmask 14 with an etching process that removes the material of the hardmask 14 selective to the materials of the block masks 18, mandrels 22, and sidewall spacers 26. The etching process may stop on the material of the hardmask 12. Some of the transferred non-mandrel lines 28 are interrupted and disjointed into sections by unetched portions of the hardmask 14 that are masked by the block masks 18 during the etching process.

Figure 8:
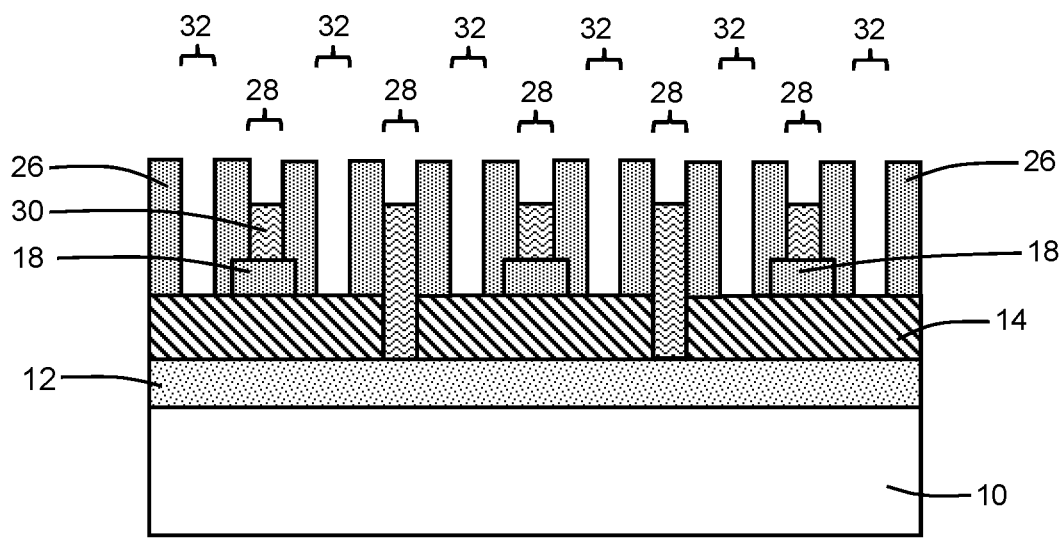

With reference to FIG. 8 in which like reference numerals refer to like features in FIG. 7 and at a subsequent fabrication stage of the processing method, an etch mask 30 is applied and recessed to fill the non-mandrel lines 28. The etch mask 30 may include material from an organic planarization layer (OPL) that is applied as a spin-on hardmask. After applying the etch mask 30, the mandrels 22 are pulled and removed selective to the block masks 18 and the sidewall spacers 26 with an etching process having a suitable etch chemistry. The removal of the mandrels 22 generates mandrel lines 32 as linear spaces, which acquire the width of the removed mandrels 22, that are arranged lengthwise between the sidewall spacers 26 and over which areas of the hardmask 14 are revealed. The non-mandrel lines 28 and the mandrel lines 32 are arranged as parallel or substantially parallel lines that alternate with each other in a lateral direction and that expose areas on the top surface of the hardmask 14.

Figure 9:
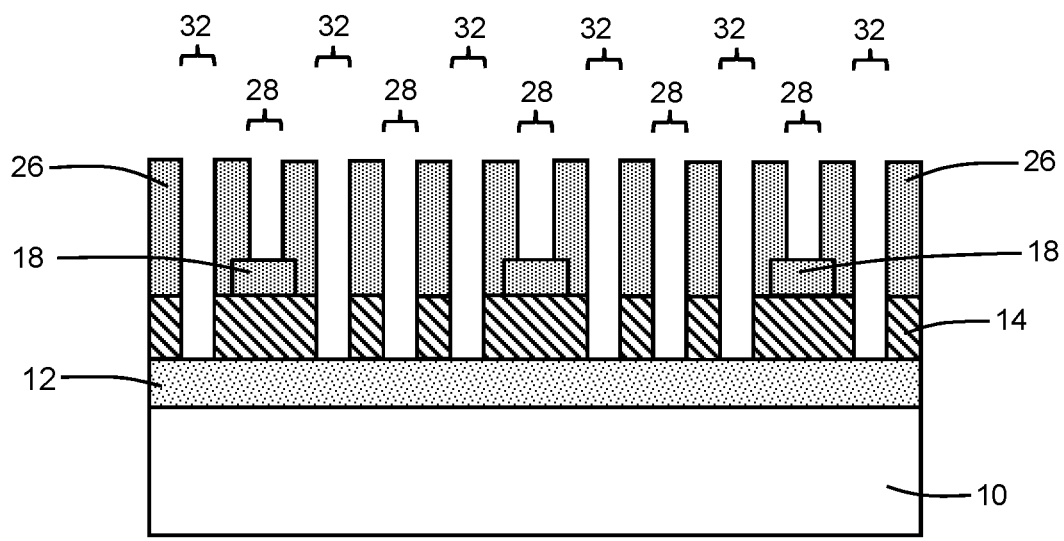

With reference to FIG. 9 in which like reference numerals refer to like features in FIG. 8 and at a subsequent fabrication stage of the processing method, the etch mask 30 is removed, and the mandrel lines 32 are transferred to the hardmask 14 by an etching process while the etch mask 30 masks the block masks 18 and the hardmask 14 over the non-mandrel lines 28. The non-mandrel lines 28 and mandrel lines 32 extend through the full thickness of the hardmask 14, and the material of the hardmask 12 may function as an etch stop for the etching process.

Figure 10:
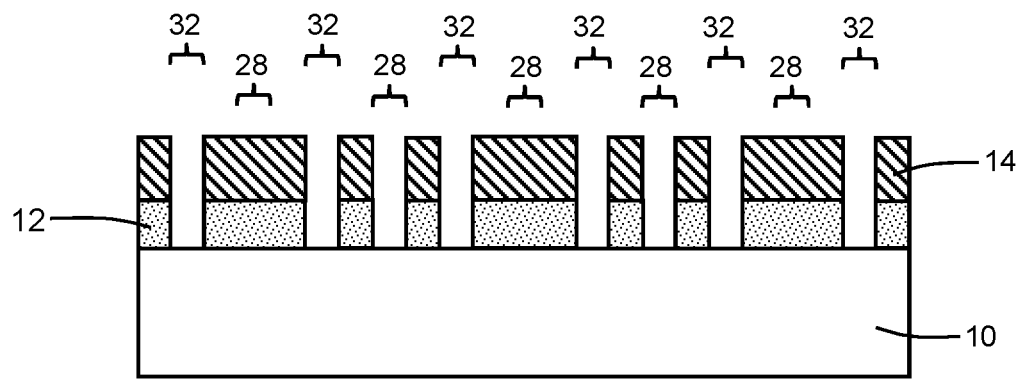

With reference to FIG. 10 in which like reference numerals refer to like features in FIG. 9 and at a subsequent fabrication stage of the processing method, the hardmask 12 is patterned by an etching process to transfer the pattern of areas masked by the block masks 18, the non-mandrel lines 28, and the mandrel lines 32 from the patterned hardmask 14 to the hardmask 12. The patterned hardmask 14 operates as an etch mask during pattern transfer. The etching process may stop on the material of the dielectric layer 10, and the non-mandrel lines 28 and mandrel lines 32 extend through the full thickness of the hardmask 12. The block masks 18 and sidewall spacers 26 may be stripped either before or after the pattern is transferred to the hardmask 12.

Figure 11:
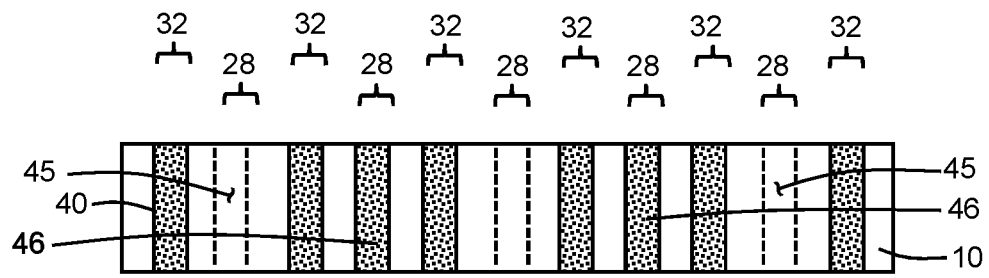
Figure 11A:
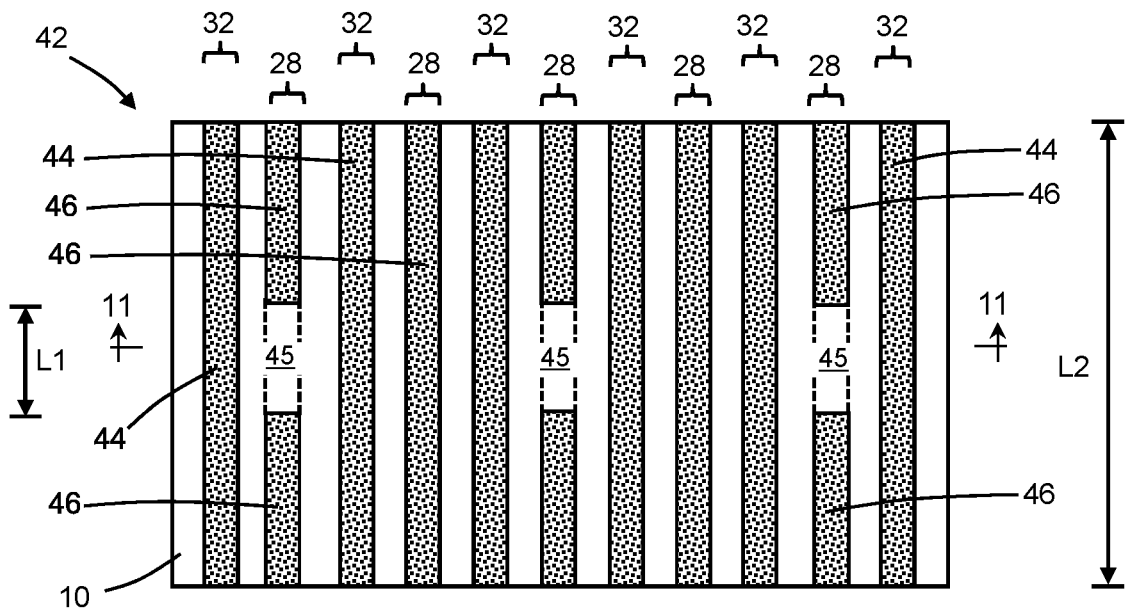

With reference to FIGS. 11, 11A in which like reference numerals refer to like features in FIG. 10 and at a subsequent fabrication stage of the processing method, the dielectric layer 10 is then patterned by an etching process with the patterned hardmask 12, and optionally the patterned hardmask 14, operating as an etch mask to transfer the pattern established by the block masks 18, non-mandrel lines 28, and mandrel lines 32 to the dielectric layer 10 as trenches 40. A back-end-of-line interconnect structure 42 is formed by filling the trenches 40 in the dielectric layer 10 with one or more conductors to form interconnects 44, 46 as features in the form of wires that are embedded in the dielectric layer 10. The interconnects 44 are formed in the dielectric layer 10 along the mandrel lines 32 in the transferred pattern, and the interconnects 46 are formed in the dielectric layer 10 along the non-mandrel lines 28 in the transferred pattern. The dielectric layer 10 includes non-mandrel cuts 45, which are arranged between some of the interconnects 46, that represent preserved sections of dielectric material of the dielectric layer 10 masked by sections of the hardmask 12 during the etching process that were formerly covered by the block masks 18.

The primary conductor of the interconnects 44, 46 may be composed of a low-resistivity metal formed using a deposition process, such as copper (Cu) or cobalt (Co) deposited by, for example, electroplating or electroless deposition or chemical vapor deposition. A liner (not shown) composed of titanium (Ti), titanium nitride (TiN), tantalum (Ta), tantalum nitride (TaN), or a layered combination of these materials (e.g., a bilayer of TaN/Ta) may be applied to the trenches 40 before filling with a primary electrical conductor. The shapes and geometries of the interconnects 44, 46 reflect areas exposed by the patterned hardmask 12 for the formation of the trenches 40 in the dielectric layer 10 during the etching process. In an embodiment, the interconnects 44, 46 may be conductive features located in a metallization level that is the closest of multiple metallization levels of the back-end-of-line interconnect structure 42 to the device structures and substrate, and in which the interconnects 44, 46 may be connected with the device structures by contacts in an intervening contact level.

The shapes of the block masks 18 are transferred from the hardmask 12 to the dielectric layer 10 as the non-mandrel cuts 45 that are arranged between pairs of interconnects 46 arranged in a row. The shapes of the block masks 18 define respective masked areas along the non-mandrel lines 28 over which portions of the dielectric layer 10 are not etched during trench formation and remain intact. The interconnects 46 have a tip-to-tip spacing or distance between their respective ends, which are respectively separated by a portion of the dielectric material of the dielectric layer 10 in the non-mandrel cuts 45, given by a dimension of the non-mandrel cuts 45 parallel to the length, L2, of the interconnects 46. The dimension of the non-mandrel cuts 45 parallel to the length, L2, of the interconnects 46 may be equal or substantially equal to the length, L1, of the block masks 18 (FIG. 2).

As part of the formation of the non-mandrel cuts 45, block masks 18 are utilized that are formed from an inorganic material, as previously described, and that reduce the incidence of systematic defects in the interconnect structure 42. The use of the block masks 18 may also alleviate the formation of necking in the interconnects 44, 46 at the locations of cuts because such block processes lack pattern distortion.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction.

Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   depositing a hardmask over a dielectric layer;
   forming a block mask that is arranged over a portion of the hardmask; and
   after forming the block mask, forming a first mandrel and a second mandrel on the hardmask,
   wherein forming the first mandrel and the second mandrel on the hardmask comprises:
   forming a sacrificial layer over the block mask and the hardmask; and
   patterning the sacrificial layer to form the first mandrel and the second mandrel, and
   wherein the first mandrel is adjacent to the second mandrel, the first mandrel is laterally spaced from the second mandrel, the portion of the hardmask is arranged between the first mandrel and the second mandrel, and the first mandrel and the second mandrel each have a non-overlapping arrangement with the block mask, and the block mask is exposed when the sacrificial layer is patterned to form the first mandrel and the second mandrel.

2. The method of claim 1 further comprising:
   forming a first sidewall spacer and a second sidewall spacer respectively arranged on the hardmask adjacent to the first mandrel and adjacent to the second mandrel.

3. The method of claim 2 wherein the block mask is comprised of titanium dioxide or silicon dioxide, and the first sidewall spacer and the second sidewall spacer are comprised of titanium dioxide or silicon dioxide.

4. The method of claim 2 wherein the block mask, the first sidewall spacer, and the second sidewall spacer are comprised of titanium dioxide.

5. The method of claim 2 wherein the block mask, the first sidewall spacer, and the second sidewall spacer are comprised of silicon dioxide.

6. The method of claim 2 wherein the block mask is comprised of a first material, the first sidewall spacer and the second sidewall spacer are comprised of a second material, and further comprising:
   removing the first mandrel and the second mandrel by an etching process selective to the first material and the second material.

7. The method of claim 6 wherein the first material is titanium dioxide or silicon dioxide, the second material is titanium dioxide or silicon dioxide, and the first mandrel and the second mandrel are comprised of amorphous silicon.

8. The method of claim 2 wherein the first sidewall spacer and the second sidewall spacer have respective overlapping relationships with opposite side edges of the block mask.

9. The method of claim 1 wherein the first mandrel and the second mandrel have a substantially parallel arrangement, the second mandrel is separated from the first mandrel by a non-mandrel line, and the portion of the hardmask is arranged between a first section of the non-mandrel line and a second section of the non-mandrel line.

10. The method of claim 9 wherein the block mask has a first side edge that is laterally spaced from the first mandrel by a first gap, and the block mask has a second side edge that is laterally spaced from the second mandrel by a second gap.

11. The method of claim 10 further comprising:
    forming a first sidewall spacer and a second sidewall spacer respectively arranged on the hardmask adjacent to the first mandrel and adjacent to the second mandrel,
    wherein the first sidewall spacer has a first overlapping relationship with the first side edge of the block mask at the first gap and the second sidewall spacer has a second overlapping relationship with the second side edge of the block mask at the second gap.

12. The method of claim 11 wherein the block mask is comprised of a first material, the first sidewall spacer and the second sidewall spacer are comprised of a second material, and further comprising:
    removing the first mandrel and the second mandrel by an etching process that is selective to the first material and the second material.

13. The method of claim 12 wherein the first material is titanium dioxide or silicon dioxide, the second material is titanium dioxide or silicon dioxide, and the first mandrel and the second mandrel are comprised of amorphous silicon.

14. The method of claim 1 wherein the block mask is comprised of an inorganic dielectric material.

15. The method of claim 14 wherein the inorganic dielectric material is titanium dioxide.

16. The method of claim 1 wherein the second mandrel is separated from the first mandrel by a non-mandrel line, the portion of the hardmask is arranged between a first section of the non-mandrel line and a second section of the non-mandrel line, and further comprising:
    removing the first section and the second section of the non-mandrel line with a first etching process to transfer a pattern to the hardmask,
    wherein the pattern includes the portion of the hardmask.

17. The method of claim 16 further comprising:
    etching the dielectric layer with a second etching process to transfer the pattern to the dielectric layer and form a first trench and a second trench in the dielectric layer at a location of the non-mandrel line; and
    filling the first trench and the second trench with a conductor to respectively form a first interconnect and a second interconnect aligned in a row with the first interconnect,
    wherein a portion of the dielectric layer is arranged between an end of the first interconnect and an end of the second interconnect, and the portion of the dielectric layer is arranged beneath the portion of the hardmask.

18. The method of claim 14 wherein the inorganic dielectric material is silicon dioxide.

19. The method of claim 1 wherein the hardmask is comprised of a metal.

* * * * *